United States Patent [19]

Tesche

[11] Patent Number: 5,334,884
[45] Date of Patent: Aug. 2, 1994

[54] THREE JUNCTION SQUID MIXER

[75] Inventor: Claudia D. Tesche, Amawalk, N.Y.

[73] Assignee: International Business Machines Corporation, Armonk, N.Y.

[21] Appl. No.: 734,729

[22] Filed: Jul. 23, 1991

[51] Int. Cl.$^5$ .................. H03K 3/38; H03K 17/92; G01R 33/02; H03M 1/00
[52] U.S. Cl. .................. 307/306; 307/541; 307/245; 307/277; 324/248; 341/133
[58] Field of Search ............ 307/306, 462, 476, 541, 307/245, 277; 324/248; 341/133

[56] References Cited

U.S. PATENT DOCUMENTS

| | | | |
|---|---|---|---|
| 4,117,354 | 9/1978 | Geewala | 307/306 |
| 4,117,503 | 9/1978 | Zappe | 357/5 |
| 4,315,255 | 2/1982 | Harris et al. | 307/306 |
| 4,509,146 | 4/1985 | Wang et al. | 307/306 |
| 4,916,335 | 4/1990 | Goto et al. | 307/306 |
| 4,956,642 | 9/1990 | Harada | 307/306 |

FOREIGN PATENT DOCUMENTS

| | | |
|---|---|---|
| 0076160 | 9/1982 | European Pat. Off. |
| 0147655 | 7/1985 | European Pat. Off. |
| 63-261885 | 10/1988 | Japan . |
| 2156620 | 10/1985 | United Kingdom . |

OTHER PUBLICATIONS

Herrell, "Damped, Three-Junction Interferometer Structures", IBM Technical Disclosure Bulletin, vol. 21, No. 12, May 1979, pp. 5053–5054.
Jones et al., "The Characteristics of Chip-to-Chip Signal Propagation in a Package Suitable for Superconducting Circuits", IBM J. Res. Develop, vol. 24, No. 2, Mar. 1980, pp. 172–177.
Yurke et al., "Observation of 4.2-K Equilibrium–Noise Squeezing via a Josephson-Parametric Amplifier," Phys. Review Letters, vol. 60, No. 9, Feb. 1988, pp. 764–767.
Enpuku et al., "Low Noise Operation of a DC Squid in a Large Regime and Its Application to the Design of a High $T_c$ Squid," IEEE Transactions on Magnetics, vol. 25, No. 2, Mar. 1989, pp. 1154–1157.
IBM Technial Disclosure Bulletin Gueret, "New Type of Single Flux Quantum Cell with Large Margins," vol. 21, No. 6, Nov. 1978, pp. 2534–2535.
IBM Technical Disclosure Bulletin, Chang, "Interferometric Measurement of Magnetic Flux," vol. 25, No. 6, Nov. 1982, pp. 2940–2941.
IBM Technical Disclosure Bulletin, Kaplan, "Three--Junction SQUID with Sharp Threshold," vol. 27, No. 4A, Sep. 1984, pp. 2157–2159.
Harada et al. "Quantum Flux Parametron with Magnetic Flux Regulator"*IEEE Transactions on Applied Superconductivity*, vol. 1, No. 2, Jun. 1991, pp. 90–94.
Shimizu et al. "Fundamental Characteristics of the QFP Measured by the DC SQUID" *IEEE Transactions on Electron Devices*, vol. 36, No. 6, Jun. 1989, pp. 1175–1181.
Patent Abstracts of Japan, vol. 9, No. 203 (P-381) Aug. 21, 1985 & JP-A-60 067 865 (Fujitsu).

*Primary Examiner*—Timothy P. Callahan
*Assistant Examiner*—Trong Phan
*Attorney, Agent, or Firm*—Scully, Scott, Murphy & Presser

[57] ABSTRACT

A three junction SQUID (superconducting quantum interference device) mixer circuit is disclosed wherein a nonlinear element such as a Josephson junction is coupled with a dc SQUID formed by two other nonlinear elements such as Josephson junctions and two input coils to provide a mixer circuit that can be employed for mixing two input magnetic flux signals. The mixer can be used for up-converting very low frequency signals, for minimizing and solving problems associated with quantum noise limitations, or for down-converting high frequency signals.

7 Claims, 2 Drawing Sheets

THREE JUNCTION SQUID MIXER

BACKGROUND OF THE INVENTION

1. Field of the Invention

The present invention relates generally to a three junction SQUID (superconducting quantum interference device), and more particularly pertains to a three junction SQUID mixer circuit wherein a nonlinear element such as a Josephson junction is coupled with a dc SQUID formed by two other nonlinear elements such as Josephson junctions and two input coils to provide a mixer circuit that can be employed for mixing two input magnetic flux signals. The mixer can be used for up-converting very low frequency signals, or for down-converting high frequency signals, in order to minimize and solve problems associated with excess noise in high resolution or quantum noise limited SQUID systems.

2. Discussion of the Prior Art

The present invention solves a significant problem associated with excess noise in the detection of magnetic flux signals, as might be present in applications in biomagnetism and in the military. No efficient alternative solution is known for minimizing and solving problems associated with excess noise, as discussed hereinbelow, in the detection of magnetic flux signals in high resolution or quantum noise limited SQUID systems.

U.S. Pat. No. 4,117,354 entitled "Two-Part Current Injection Interferometer Amplifiers and Logic Circuits" discloses Josephson junction interferometers having nonlinear switching or threshold characteristics. The nonlinear threshold characteristic is achieved in a preferred manner by applying an injection current to the interferometer at a point in the interferometer which is different from where its gate current is normally applied. The resulting nonlinearity provides for high amplification. The nonlinear switching characteristic may also be achieved by applying an injection current to the same point on the interferometer where the gate current is normally applied. However, a portion of the applied injection current is electromagnetically coupled to the interferometer inductance to achieve a desired nonlinear switching characteristic.

U.S. Pat. No. 4,117,503 entitled "Josephson Interferometer Structure which Suppresses Resonances" discloses that Josephson interferometers with inductive, capacitive and resistive components are subject to the presence of relatively high amplitude resonances similar to those found in in-line gases. Interferometer structures exhibit the same resonant behavior as long tunnel junctions, except that there exist only as many discrete resonance voltages as meshes in the interferometer device. Hence a two junction interferometer has one resonance as compared to two resonances in a three junction device. In the I-V characteristic of a Josephson tunneling device, such as an interferometer, such resonances appear as current steps which must be taken into account in the design of Josephson switching circuits primarily to avoid a situation wherein the load line of an external load intersects a resonance peak. Where the load line and the resonance peak intersect because such an intersection is stable, the device is prevented from switching to the full voltage desired. Such resonances can be effectively suppressed in interferometers by providing a resistance which is in parallel with the main inductance of the interferometer. In a two junction interferometer, the resistance is effectively connected between the base electrode metallizations which are utilized to form one of the electrodes of each of the pair of electrodes required for each interferometer junction. To the extent that more than two junctions are utilized, the resonance suppressing resistor is connected between pairs of junctions and across the main inductances which interconnect the junctions. The structure of a two junction interferometer with a resonance-suppressing resistor is shown as well as the schematics of a multiple junction interferometer which clearly indicates how such structures may be fabricated.

U.S. Pat. No. 4,916,335 entitled "Superconducting Circuit" describes a quantum flux parametron-type superconducting circuit in which a path with a Josephson device is connected in parallel with exciting inductors of the quantum flux parametron or inductors of exciting line magnetically coupled with the exciting inductors, thereby constructing a phase regulator.

Japanese Patent 63-261885 entitled "Three-Junction DC SQUID Gate" describes a superconducting closed circuit constituted of first, second and third branch lines which are connected to a gate current line at both ends and in parallel with each other. The first branch line includes a series circuit of an inductance and a Josephson having a critical current value. The second branch line includes only a Josephson element having a second critical current value. The third branch line includes a series circuit of an inductance and a Josephson element having a third critical current value. The inductances constitute an asymmetrical three junction DC SQUID gate coupled with a control current line by magnetic induction. A sufficiently wide operation margin can be obtained while high gain or high sensitivity is maintained.

European Patent Application 0 076 160 entitled "Josephson Junction Logic Device" discloses a Josephson junction logic device comprising at least first and second superconductive loops and at least two logic input signal lines, with each of the logic input signal lines being arranged to be opposite to one of the superconductive loops so that each logic input signal line is able to magnetically coupled with only said one of the superconductive loops and is magnetically independent from the other superconductive loop, whereby the allowable range for maintaining the device in a superconductive state is expanded.

IBM Technical Disclosure Bulletin 21062534 by P. Gueret entitled "New Type of Single Flux Quantum Cell with Large Margins" describes a center-feed three junction interferometer having junctions in series with a center inductance.

IBM Technical Disclosure Bulletin 274A2157 by S. B. Kaplan describes a multi-junction logic device using two superconductive loops with three Josephson junctions and two input signal lines. Kaplan also discloses a similar SQUID having only a single input coil in which the circuit uses an input signal in the input coil to switch the SQUID from a zero voltage state into a voltage state. This is a common feature in all of the prior art references which are aimed at computer switching and memory circuit applications in which one of the two inputs is in the form of a flux linked into the SQUID through a coil, and the other input is applied directly to the SQUID junctions through a gate current. The three Josephson junction arrangement disclosed herein is similar to that of the present invention, but Kaplan does not disclose or teach or even consider the use of the arrangement as a mixing device for up-converting very low frequency signals, thereby minimizing and solving problems with low frequency noise limitations, or for down-converting high frequency signals.

IBM Technical Disclosure Bulletin 25062940 by W. H. Chang describes a three junction Josephson interferometer with two superconducting loops which have a slight mismatch in their LIo products to provide a slightly asymmetric interferometer.

SUMMARY OF THE INVENTION

None of the prior art discussed hereinabove discloses or teaches circuits operating in a manner similar to the present invention wherein a three junction superconducting quantum interface device comprising a nonlinear element such as a Josephson junction is coupled in combination with two other junctions and connected to two input coils to provide a circuit that can be employed as a mixing device for mixing two input magnetic flux signals.

In contrast to the prior art, particularly Kaplan, in the subject invention the SQUID is biased at some fixed current level which replaces a variable gate current in all the prior art devices. Moreover, the voltage across the SQUID changes because the two input fluxes are mixed by the nonlinear characteristics of the three junction SQUID, which is very distinct from the threshold switching of the devices of the prior art.

Accordingly, it is a primary object of the present invention to provide a three junction SQUID wherein a nonlinear element such as a Josephson junction is coupled with a dc SQUID formed by two other junctions and two input coils to provide a circuit that can be employed as a mixing device for mixing two input magnetic flux signals. The device can be used for up-converting very low frequency signals, or for down-converting high frequency signals, in order to minimize and solve problems associated with excess noise in high resolution or quantum noise limited SQUID systems.

BRIEF DESCRIPTION OF THE DRAWINGS

The foregoing objects and advantages of the present invention for a three junction SQUID mixer may be more readily understood by one skilled in the art with reference being had to the following detailed description of several preferred embodiments thereof, taken in conjunction with the accompanying drawings wherein like elements are designated by identical reference numerals throughout the several views, and in which:

FIG. 2b illustrates the voltage V across a dc SQUID as a function of the flux $\Phi/\Phi_o$ at the fixed current bias indicated by the dashed line in FIG. 2a;

DETAILED DESCRIPTION OF THE DRAWINGS

Theory and Operation of SQUID Systems

Figure 1:
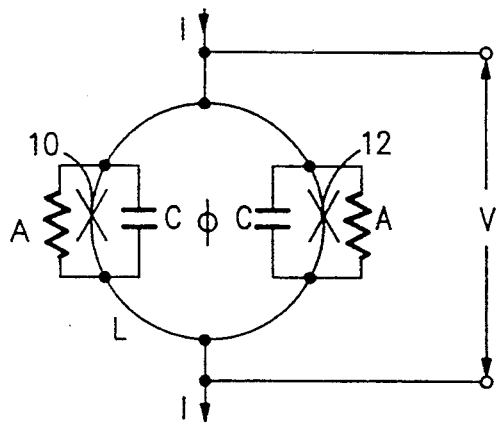
FIG. 1 illustrates a schematic of a typical prior art dc SQUID comprising two Josephson junctions coupled in a superconducting loop, biased with a current I and operating with a flux $\phi$.

Superconducting quantum interference devices (SQUIDs) are well known in the art, and are normally designed with either one or two Josephson junctions (or other nonlinear elements such as a weak link which exhibit a nonhysteretic current to voltage characteristic similar to a Josephson junction) which operate at a temperature of a few degrees kelvin, and provide a magnetic flux detector of extreme sensitivity. By connecting it to a suitable circuit, sensitive measurements are possible of a wide range of physical parameters, including voltage, resistance, magnetic field gradient, magnetic susceptibility and displacement.

The two junction or dc SQUID first appeared in 1964 and was quite widely used by low temperature physicists. The year 1970 saw the appearance of the single junction or rf SQUID, which became commercially available and therefore much more widely used than the dc device, particularly by nonspecialists working outside the confines of a low temperature laboratory. However, in the mid-1970s the realization that the dc SQUID was potentially much more sensitive than the rf SQUID, together with the advent of thin-film technology which made it no more difficult to make two junctions than one, led to extensive development of the dc SQUID.

The macroscopic theory of superconductivity developed by John Bardeen, Leon Cooper and Robert Schrieffer indicates that below the superconducting transition temperature, which is typically a few degrees kelvin in conventional superconducting materials, at least some of the free electrons in a superconducting material are bound together in pairs. Each of these "Cooper pairs" consists of two electrons with opposite spins and, in the absence of applied currents or magnetic fields, equal and opposite momenta, so that the net spin and net momentum are both zero. The pairs condense into a single macroscopic quantum state described by the macroscopic wavefunction $$\psi(r,t) = [\psi(r,t)] e^{i\Phi(r,t)}$$

The phase $\Phi(r,t)$ is coherent throughout the superconductor. Thus superconductivity is a macroscopic quantum phenomenon.

The long range order of the condensate has many important consequences. First, it gives rise to infinite electrical conductivity. A current induced in a superconducting ring is carried by Cooper pairs and persists forever. However, the magnetic flux through the ring generated by this current cannot take arbitrary values but is quantized in units of the flux quantum $\Phi_o$, which is the ratio of Planck's constant to the charge of a Cooper pair: h/2e. or about $2 \times 10^{-15}$ Wb. Thus the enclosed flux $\Phi$ is an integral multiple of the flux quantum: $\Phi = n\Phi_o$, $n=0,1,2,\ldots$. This phenomenon of flux quantization is another consequence of the macroscopic wavefunction; the requirement that $\psi(r,t)$ be single valued means that the phase $\Phi(r,t)$ must change by exactly $2\pi n$ on going once around the ring.

A third consequence of long range phase coherence is Josephson tunneling, first proposed by Brian Josephson in 1962. Consider two superconductors separated by a thin insulating barrier through which Cooper pairs can tunnel quantum mechanically, maintaining phase coherence between the two superconductors in the process. Josephson showed that the difference $\delta$ between the phases on the two sides of the junction is related to the supercurrent I flowing through the barrier by the relation $\sin \delta = I/I_o$, where $I_o$ is the critical current, that is, the maximum supercurrent that the junction can sustain. For applied currents greater than the critical current, a voltage V exists across the junction, and the phase difference $\delta$ increases with time as $d\delta/dt = 2\pi V/\Phi_o$.

Flux quantization and Josephson tunneling are essential operational characteristics of a SQUID.

Two Josephson tunnel junctions connected in parallel in a dc SQUID as indicated in FIG. 1 demonstrate quantum interference. As the magnetic flux $\Phi$ through the superconducting loop is changed, the critical current of the two junctions oscillates with a period equal to the flux quantum $\Phi_o$. These oscillations arise from interference between the macroscopic wavefunctions at the two junctions just as the interference between two coherent light beams in an optical arrangement gives rise to bright and dark fringes.

Figure 2A:
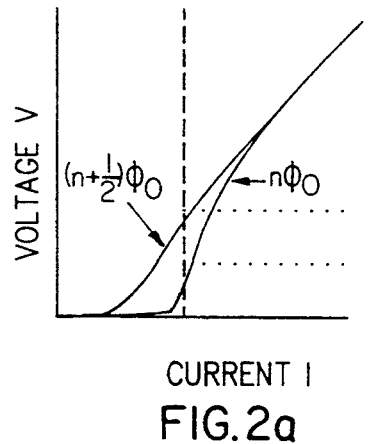
FIG. 2a depicts the current/voltage characteristic of a dc SQUID with fluxes of $n\Phi_o$ and $(n+\frac{1}{2})\Phi_o$.
Figure 2B:
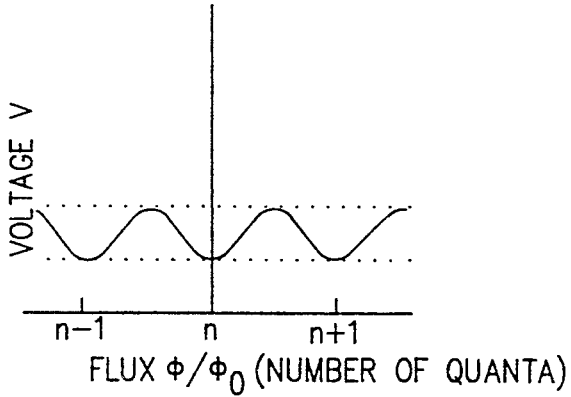

FIG. 1 is a schematic of a dc SQUID biased with a current I and flux $\Phi$. Each of the two Josephson tunnel junctions (indicated by crosses) is shunted with its self-capacitance C and an external resistance R. The inductance of the loop is L. The current-voltage characteristics in FIG. 2a are those of a SQUID with fluxes $n\Phi$ and $(n+\frac{1}{2})\Phi_o$. The plot in FIG. 2b shows the voltage V across the SQUID as a function of the flux $\Phi/\Phi_o$ at the fixed current bias indicated by the dashed line in FIG. 2.

In a conventional mode of operation of a dc SQUID, its current-voltage characteristic must be non-hysteretic. This can be ensured by adding an external shunt with a sufficiently low resistance. When the flux through the SQUID is changed, the I-V characteristic oscillates smoothly between two extremes, which are indicated in FIG. 2a. Thus when the SQUID is biased with a constant current, the voltage across the SQUID is periodic in the applied flux, as shown in FIG. 2b. The device is normally operated with a flux bias of about $(2n+1)\Phi_o/4$, for which the voltage is almost linear in the applied flux.

Thus the SQUID is a flux-to-voltage transducer that converts a change in magnetic flux to a change in voltage readily detectable with conventional electronics. However, because one often needs a dynamic range of flux considerably greater than a fraction of a flux quantum, the SQUID is usually operated as the null detector in a feedback circuit. In this mode, any change in voltage across the SQUID produced by an applied magnetic flux is amplified and converted into a current through a coil coupled to the SQUID to produce an equal and opposite flux. To avoid drifts and low frequency noise in the electronics, the SQUID is operated in a flux locked mode and one applies an alternating flux to the SQUID and amplifies the resulting alternating voltage across the device. In this way, one can not only detect a change in flux of much less than the flux quantum $\Phi_o$ but also measure an applied flux corresponding to many flux quanta. The frequency response of a flux locked SQUID typically ranges from zero to tens of kilohertz.

The concept of "flux-noise energy" is useful in addressing the resolution of a dc SQUID. If the smallest flux change a SQUID can resolve in a unit bandwidth at a frequency f is $\delta\Phi(f)$, one can define a flux-noise energy per unit bandwidth given by $\epsilon(f) = (\delta\Phi)^2/2L$, where L is the inductance of the SQUID. The smaller the value of the flux-noise energy $\epsilon(f)$, the better the resolution. The equivalent flux noise $\delta\Phi$ is just the ratio of the voltage noise $\delta V$ across the SQUID per unit bandwidth to the flux-to-voltage transfer function $\partial V/\partial \Phi$.

To calculate the voltage noise and the transfer function the equations for a SQUID were solved assuming that the only sources of noise were the two independent Nyquist, or thermal, noise currents produced by the shunt resistors. From this analysis it was concluded that with appropriate current and flux biases, the SQUID achieves its optimum noise energy when $2LI_o \approx \Phi_o$. The optimum noise energy is then $\epsilon \approx 10\, k_B T(LC)^{\frac{1}{2}}$ Here $k_B$ is Boltzmann's constant, C is the capacitance of one of the tunnel junctions and T is the absolute temperature. The message of this equation is clear: Smaller is better. Thus if one can decrease the inductance of the SQUID loop or the area and hence the capacitance of the junctions, the noise energy will be correspondingly reduced. Cooling the device to a lower temperature should give further improvement.

The prediction for the noise energy motivated numerous groups to fabricate a wide variety of devices using thin-film technology pioneered by IBM. Photolithography or electronbeam lithography can produce tunnel junctions with areas that range from perhaps 5 square microns down to 0.1 square microns or even smaller. The above equation predicts fairly well the dependence of the noise energy on the inductance L and capacitance C. In a period of a few years the optimum noise energy $\epsilon$ has been decreased by about four orders of magnitude.

Like all electronic devices, SQUIDs exhibit "1/f noise," that is, noise with a spectral density that scales inversely with frequency. The origin of this noise, which limits the resolution at low frequencies, is only now becoming understood. The critical current of a single Josephson tunnel junction exhibits 1/f noise that arises from the trapping and detrapping of electrons in the barrier, but this effect is too small to account for the 1/f noise observed in many SQUIDs. Thus it appears that there is an additional source of 1/f noise, conceivably the motion of magnetic flux trapped in the body of the SQUID. SQUIDs fabricated recently from low Tc superconducting materials have shown very low levels of 1/f noise. 1/f noise levels in SQUIDs fabricated from high Tc materials are considerably higher. The physical difference between these and other, much noisier devices is still being investigated. The rf SQUID consists of a superconducting loop interrupted by a single Josephson junction. The loop is coupled to the inductor of an LC-resonant circuit excited by a radiofrequency current at about 30 MHz. The amplitude of the alternating voltage across the resonant circuit is periodic in the flux through the SQUID with a period $\Phi_o$, so that with suitable electronics one can operate the rf SQUID in a flux-locked loop in much the same way as one does the dc SQUID. The sensitivity of the rf SQUID is not nearly as good as that of the dc SQUID.

Scientists in many fields have put both rf and dc SQUIDs to a remarkably wide range of uses. Laboratory-based measurements performed with SQUIDs include determination of the magnetic susceptibilities of tiny samples over a wide range of temperature, measurement of quasiparticle charge imbalance in superconductors, detection of nuclear magnetic and quadrupole resonance, and noise thermometry, which is the use of noise measurements to determine temperature.

One area of growing importance is biomagnetism. Investigators have used SQUIDs to study magnetic fields generated by the heart and brain to detect eye movements and even to detect magnetic impulses generated by isolated frog nerves, to give just a few examples. Another important area is geophysics, magnetotellurics, rock magnetism and paleomagnetism, for example. SQUIDs also see use in relatively large scale experiments, including gravity-wave antennas, magnetic-monopole detectors and an orbiting gyro test of general relativity.

In many of the above experiments, excess noise, particularly that associated with low frequency noise sources intrinsic to SQUIDs fabricated from high Tc materials, is or would be a significant problem.

For example, biomagnetic signals are extremely small, ranging from about 1 picotesla from the heart to as little as 100 femtoteslas from the brain. Present-day SQUIDs fabricated from conventional superconducting materials have a noise level substantially lower than these values. However, the noise levels of high Tc SQUIDs are in excess of the biomagnetic signals at the frequencies of interest (1Hz-1KHz).

Figure 3:
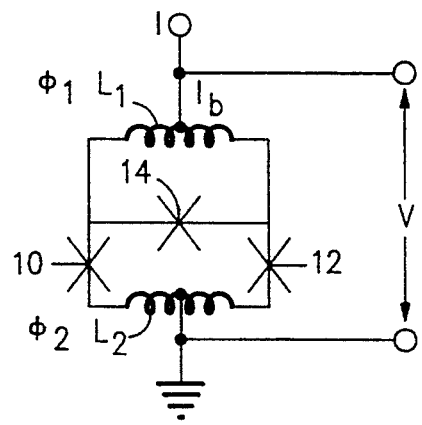
FIG. 3 illustrates a first embodiment of a three junction SQUID mixer pursuant to the teachings of the present invention.

FIG. 3 illustrates a first embodiment of a three junction SQUID mixer pursuant to the teachings of the present invention. Referring thereto, a conventional double junction dc SQUID includes first and second Josephson junctions 10, 12 with first and second input coils L1, L2. Pursuant to the teachings of the present invention, a third Josephson junction 14 is coupled in parallel with one of the input coils L1 or L2 to form a three junction SQUID mixer. It should be emphasized that although elements 10, 12 and 14 are illustrated as Josephson junctions, other nonlinear elements such as weak links could be used in place thereof provided that they have a nonlinear current to voltage characteristic similar to a Josephson junction. The shunting junction formed by the third SQUID 14 can be either hysteretic or non-hysteretic (shunted with a small external resistance), and has a current K flowing therethrough.

In operation, magnetic flux signals $\Phi_1$ and $\Phi_2$ are linked into inductances $L_1$ and $L_2$ respectively. The output signal (voltage V) is determined by the input applied fluxes $\Phi_1$, $\Phi_2$, the bias current I, and the SQUID parameters. The operation of the three junction SQUID can be understood by the following general explanation. In the three junction SQUID, the net SQUID inductance in the loop containing the junctions 10 and 12 is reduced from the sum of the two inductances, $L_1+L_2$, to approximately $L_2$ if the shunting junction 14 is switched into the superconducting state from some normal state resistance. The change in inductance is reflected by a change in the forward transfer function, $dV/d\Phi$. Thus the output signal generated by $\Phi_1$ and $\Phi_2$ depends upon whether or not the signal fluxes switch junction 14. If this junction is strongly hysteretic, the device will appear to have a threshold. If the shunting junction 14 is not hysteretic, more conventional mixing of the two flux signals will occur. $I_c$ is directed to a coil inductively coupled with input coils In operation of the circuit of FIG. 4, if a mixing current $I_c$ is directed to a coil inductively coupled with input coils $L_{1a}$ and $L_{1b}$, a flux $\Phi_M$ will be introduced into the upper loop of the SQUID, and if a signal current $I_d$ is directed to a coil inductively coupled to input coils $L_{2a}$ and $L_{2b}$, a flux $\Phi_S$ will be introduced into the lower loop of the SQUID.

Figure 4:
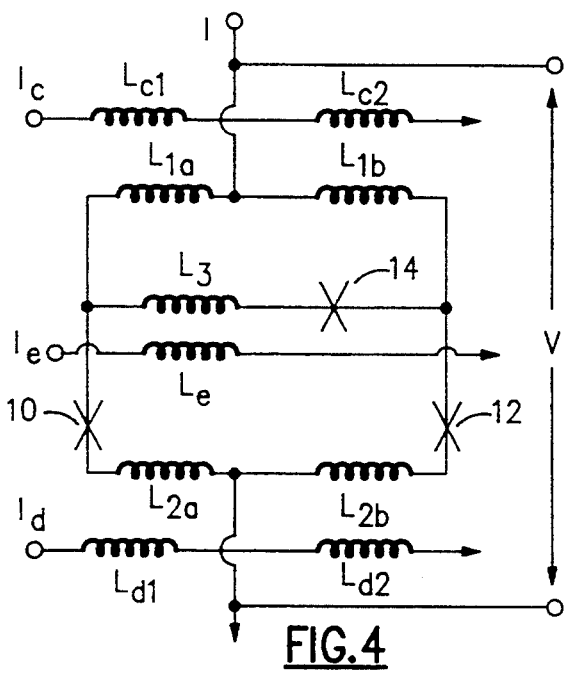
FIG. 4 depicts a second, more comprehensive embodiment of a three junction SQUID mixer pursuant to the subject invention.

The operation of the circuits of FIGS. 3 and 4 depends upon the fluxes ($\Phi_1\Phi_2$) and ($\Phi_M$, $\Phi_S$) being introduced into separate coils or inductances, not a single coil or inductance as would occur in the SQUID shown in FIG. 1. As a result, the output voltage $V(\Phi_M, \Phi_S)$ for a three junction SQUID is not equivalent to the output voltage $V_o(\Phi_M+\Phi_S)$ for a conventional dc SQUID. In a conventional dc SQUID, if a Taylor series expansion is performed upon $V_o(\Phi_M+\Phi_S)$ one obtains $$V_o(\Phi_M + \Phi_S) = V_o(\Phi_o) + \frac{\partial V_o}{\partial \Phi_T}(\Delta\Phi_M + \Delta\Phi_S) +$$

$$\frac{1}{2} \frac{\partial^2 V_o}{\partial \Phi_T^2}[(\Delta\Phi_M + \Delta\Phi_S)^2] + \ldots$$

Where $\Phi_T = \Phi_M + \Phi_S$.
The conventional SQUID is biased such that $$\frac{\partial V_o}{\partial \Phi_T}$$

is maximized, and $\partial^2 V_o/\partial \Phi_T^2$ is zero.

The term $(\Delta\Phi_M+\Delta\Phi_S)^2$ and higher order terms are negligible, and hence contributions to the voltage produced by mixing of the input signals is minimal.

If one performs a Taylor series expansion upon $V(\Phi_M, \Phi_S)$, for a three junction SQUID one obtains $$V(\Phi_M, \Phi_S) = V(\Phi_{Mo}, \Phi_{So}) + \frac{\partial V}{\partial \Phi_M}\Delta\Phi_M + \frac{\partial V}{\partial \Phi_S}\Delta\Phi_S +$$

$$\frac{1}{2} \frac{\partial^2 V}{\partial \Phi_M^2}\Delta\Phi_M^2 + \frac{1}{2} \frac{\partial^2 V}{\partial \Phi_S^2} + \frac{\partial^2 V}{\partial \Phi_M \partial \Phi_S}\Delta\Phi_M\Delta\Phi_S + \ldots$$

In the above equation, $$\frac{\partial^2 V}{\partial \Phi_M \partial \Phi_S}\Delta\Phi_M\Delta\Phi_S$$

is the mixing term of interest, and the bias point and SQUID parameters are chosen to maximize that mixing term.

Figure 5:
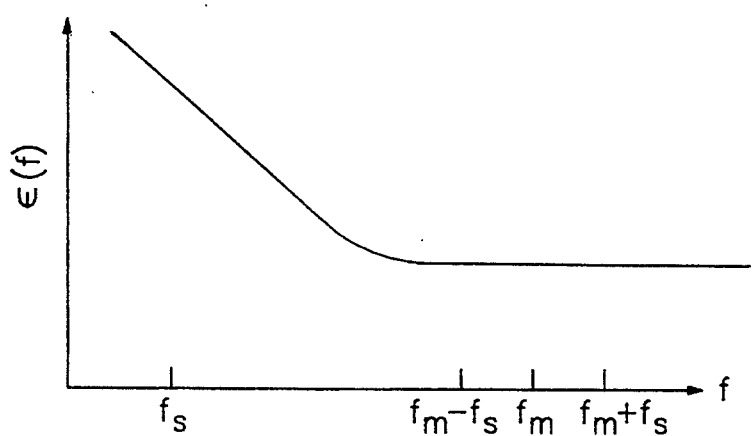
FIG. 5 is a plot of flux noise energy e as a function of frequency f, and illustrates how the mixer of the present invention minimizes and solves problems associated with spectral density noise.

Low frequency noise with spectral density 1/f is intrinsic to operation of a SQUID, and has a characteristic as shown in FIG. 5 which is a plot of flux noise energy $\epsilon$ as a function of frequency f, and illustrates how the mixer of the present invention minimizes and solves problems associated with spectral density noise.

In a conventional SQUID with low frequency noise, the response is dominated by the linear term in the expansion. Hence arbitrary low frequency fluctuations in the output voltage cannot be circumvented.

This adverse effect can be eliminated by the present invention.

Referring to FIG. 5, the low frequency of the signal flux $\Phi_S$ at frequency $f_S$ is within the portion of the curve which produces a significant noise output $\epsilon(f)$, whereas the frequency of the mixing flux $\Phi_M$ is chosen such that the mixed terms $(f_M \pm f_S)$ are at high enough frequencies to be beyond the low frequency noise region.

FIG. 4 depicts a second, more comprehensive embodiment of a three junction SQUID mixer pursuant to the subject invention, and illustrates that three signals $I_c$, $I_d$, $I_e$, can be introduced into the device through external bias lines. The parameters $I_c$, $I_d$, $I_e$ represent three signal currents. The embodiment of FIG. 4 is more comprehensive in that it illustrates directly the capacitance associated with each Josephson junction along with a shunt resistance for each junction, and also illustrates inductive coupling coils for each input coil $L_{1a}$, $L_{1b}$ and $L_{2a}$, $L_{2b}$ and a third input coil $L_3$ associated with Josephson junction 14 and a coupling coil therefor.

Embodiments are also possible wherein the coupling coil for each input inductance coil L is eliminated, and $\Phi$ is an external flux introduced directly into the SQUID loop.

Figure 6:
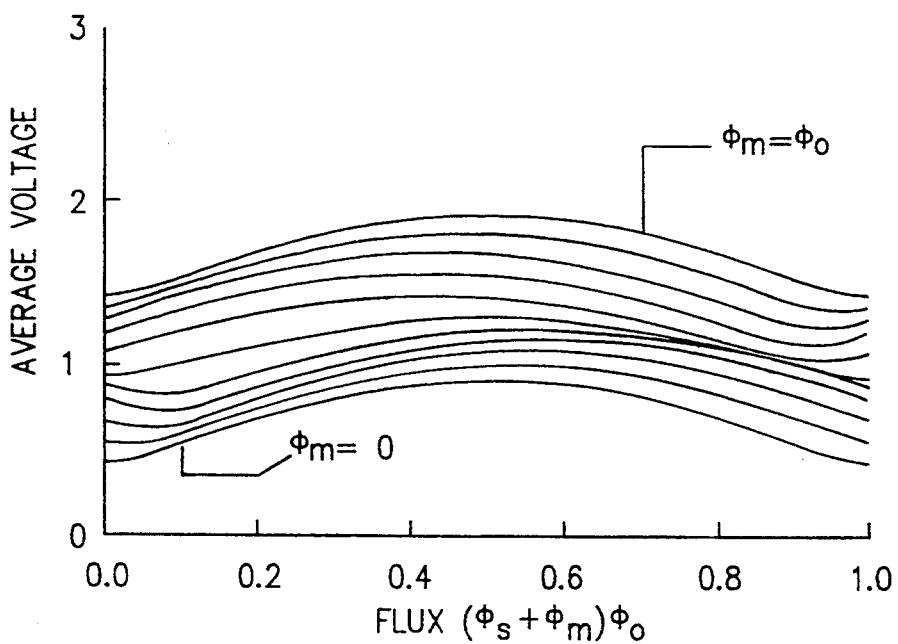
FIG. 6 illustrates a family of curves, for various values of $\Phi_M$, of the average voltage as a function of the sum of the fluxes $\Phi_S$ and $\Phi_M$, which are useful in explaining the operation of the present invention.

FIG. 6 illustrates a family of curves, for various values of $\Phi_M$, of the average voltage as a function of the slum of the fluxes $\Phi_X$ and $\Phi_M$, which are useful in explaining the operation of the present invention for a three junction SQUID mixer. The family of curves for various values of $\Phi_M$ show a variation in shape, illustrating the dependence on both $\Phi_M$ and $\Phi_S$ in a nonlinear fashion.

Figure 7:
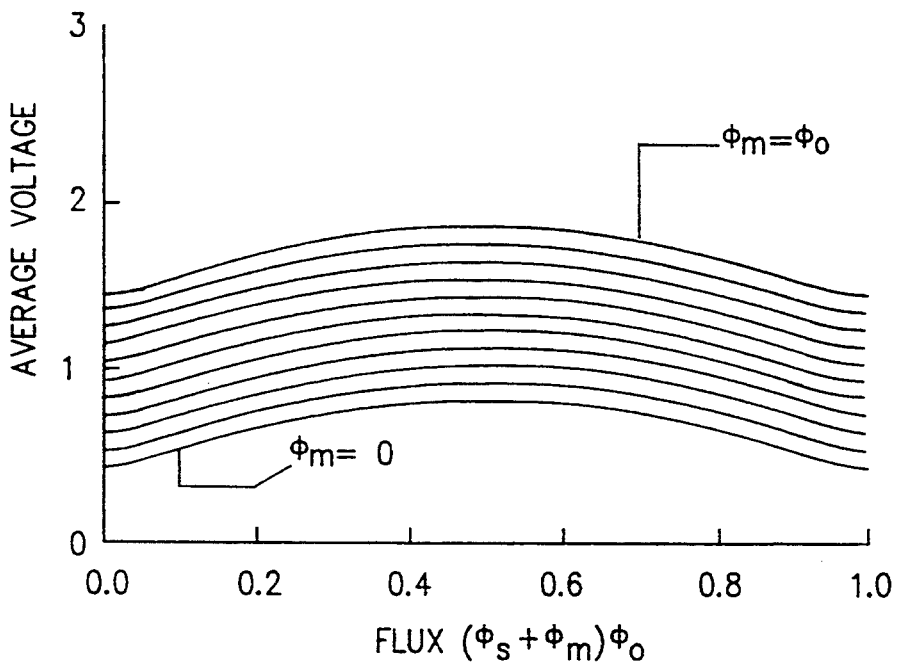
FIG. 7 illustrates a family of curves, for various values of $\Phi_M$, of the average voltage as a function of the sum of the fluxes $\Phi_S$ and $\Phi_M$, which are useful in explaining the operation of a conventional dc SQUID in a flux locked loop.

FIG. 7 illustrates a family of curves, for various values of $\Phi_M$, of the average voltage as a function of the sum of the fluxes $\Phi_S$ and $\Phi_M$, which are useful in explaining the operation of the conventional SQUID. The average voltage for each successive value of $\Phi_M$ is displaced upward for clarity. The curves are identical in shape, illustrating the dependencies of the voltage on the sum $\Phi_M + \Phi_S$.

Figure 8:
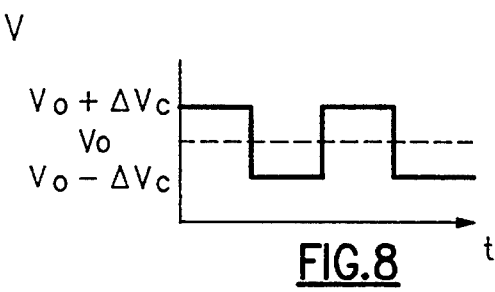
FIG. 8 illustrates a curve of the signal voltage out as a function of time for the conventional dc SQUID.

FIG. 8 illustrates a conventional SQUID operated in a phase locked loop mode, and also shows a curve of the signal voltage out. In a phase locked loop mode, a $\Delta\Phi_S$ signal is received as an input, and is modulated typically at 100 KHz. FIG. 8 illustrates the signal out oscillating between a high value of $V_o + \Delta V_o$ and a lower value of $V_o - \Delta V_o$, where $$\Delta V_o = \left(\frac{\partial V}{\partial \Phi_T}\right)(\Delta\Phi_S + \Delta\Phi_M).$$

The three junction SQUID can also be operated in a phase locked loop mode in a similar fashion, with modulation frequency greater than $f_M + f_S$.

Possible applications of the present invention include up-converting very low frequency signals above the intrinsic 1/f of the SQUID, and down-converting high frequency signals below the modulation frequency of the phase locked loop usually used in DC SQUID readout circuits.

While several embodiments and variations of the present invention for a three junction SQUID mixer are described in detail herein, it should be apparent that the disclosure and teachings of the present invention will suggest many alternative designs to those skilled in the art.

Having thus described our invention, what we claim as new and desire to secure by Letters Patent is:

1. A three junction superconducting quantum interface device mixer for mixing two input magnetic flux signals to enable heterodyning for up-converting low frequency signals or down-converting high frequency signals, to minimize noise in the superconducting quantum interference device, comprising:

a) a dc superconducting quantum interface circuit comprising a series circuit pair of first and second nonlinear elements, each having current to voltage characteristic similar to a Josephson junction and first and second input coils for the dc superconducting quantum interface circuit; and b) a third nonlinear element having a current to voltage characteristic similar to a Josephson junction coupled in parallel with one of the input coils forming an additional or third shunting junction having a current flowing therethrough to provide a circuit that can be employed as a mixing device for mixing two input magnetic flux signals to enable heterodyning for up-converting low frequency signals or down-converting high frequency signals, to minimize noise in the superconducting quantum interference device.

2. A three junction superconducting quantum interface device as claimed in claim 1, wherein each said nonlinear element comprises a Josephson junction.

3. A three junction superconducting quantum interface device as claimed in claim 1, wherein said third nonlinear element has a third input coil connected in series therewith.

4. A three junction superconducting quantum interface device as claimed in claim 1, wherein each of said input coils has an inductive coil inductively coupled therewith for introduction of a flux thereto.

5. A three junction superconducting quantum interface device as claimed in claim 1, wherein the superconducting quantum interface device is biased with a fixed amplitude current.

6. A three junction superconducting quantum interface device as claimed in claim 1, wherein the three junction superconducting quantum interface device mixer up-converts the frequency of very low frequency signals above intrinsic 1/f noise of the superconducting quantum interface device.

7. A three junction superconducting quantum interface device as claimed in claim 1, including a phase locked loop readout circuit employing a modulation frequency, and wherein the three junction superconducting quantum interface device mixer down-converts the frequency of high frequency signals below the modulation frequency of the phase locked loop readout circuit.

* * * * *